(12) United States Patent
Taft

(10) Patent No.: US 7,068,194 B1
(45) Date of Patent: Jun. 27, 2006

(54) HIGH-DENSITY MOS-DECODED UNARY DAC

(75) Inventor: Robert Callaghan Taft, Munich (DE)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/085,909

(22) Filed: Mar. 21, 2005

(51) Int. Cl.
*H03M 1/00* (2006.01)

(52) U.S. Cl. .................. 341/136; 341/144; 341/145

(58) Field of Classification Search ............... 341/136, 341/133, 144, 145, 134, 135
See application file for complete search history.

(56) References Cited

U.S. PATENT DOCUMENTS

| | | | | |
|---|---|---|---|---|
| 5,254,994 | A * | 10/1993 | Takakura et al. | 341/153 |
| 5,945,851 | A * | 8/1999 | Tu et al. | 327/65 |
| 6,271,779 | B1 * | 8/2001 | Yokomizo | 341/136 |
| 6,741,195 | B1 * | 5/2004 | Cho | 341/136 |

OTHER PUBLICATIONS

National Semiconductor Corporation, "A/D Converter," web article, *Signal News*, 2004 (2 pages), no month available.

National Semiconductor, "ADC08D1000 High Performance, Low Power, Dual 8-Bit, 1 GSPS A/D Converter," Sep. 2004 (31 pages).

Ozan E. Erdogan, et al., "A 12b Digital-Background-Calibrated Algorithmic ADC with -90dB THD," *IEEE*, Feb. 17, 1999 (3 pages).

Michael Choi, et al., "A 6b 1.3GSample/s A/D Converter in 0.35pm CMOS," *IEEE*, Feb. 6, 2001 (3 pages).

Rudy J. Van De Plassche et al., "A High-Speed 7 Bit A/D Converter," *IEEE*, Dec. 6, 1979 (6 pgs).

Kevin Kattmann et al., "A Technique for Reducing Differential Non-Linearity Errors in Flash A/D Converters," *IEEE*, Feb. 14, 1991 (2 pgs).

Klaas Bult et al., "An Embedded 240-mW 10-b 50-MS/s CMOS ADC in 1-mm$^2$," *IEEE*, Dec. 12, 1997 (9 pgs).

Opris et all, "A Single-Ended 12b 20MSample/s Self-Calibrating Pipeline A/D Converter," *ISSCC*, Feb. 6, 1998 (3 pgs).

D. Fu et al., "Digital Background Calibration of a 10b 40MSamples/s Parallel Pipelined ADC," *ISSCC*, Feb. 6, 1998 (3 pgs).

(Continued)

*Primary Examiner*—John B Nguyen
(74) *Attorney, Agent, or Firm*—Brett A. Hertzberg; Merchant & Gould

(57) ABSTRACT

Multiple switching circuits and current source circuits are arranged to operate as part of a compact unary DAC cell. The compact unary DAC cell can be combined with additional compact unary DAC cells to provide a scalable unary DAC system that may be segmented, non-segmented, single-ended, differential, or some other DAC topology that may employ one or more unary DAC cells. Each unary DAC cell is preferably comprised of transistors of a single type such that the maximum circuit density can be achieved. The current source circuits may each have equal current magnitudes. The total output current from the unary DAC cell corresponds to the combined currents from each of the current sources that are enabled.

20 Claims, 11 Drawing Sheets

OTHER PUBLICATIONS

K. Dyer et al., "Analog Background Calibration of a 10b 40MSample/s Parallel Pipelined ADC," *IEEE,* Feb. 17, 1999 (3 pgs).

William Ellersick et al., "GAD: A 12-GS/s CMOS 4-bit A/D converter for an Equalized Mulit-Level Link," *Symposium on VLSI Circuits Digest of Technical Papers,* 1999 (4 pgs), no month.

Jun Ming et al., "An 8b 80MSample/s Pipelined ADC with Background Calibration," *IEEE,* Feb. 7, 2000 (3 pgs).

Kouji Sushihara et al., "WP 26.2 A 6b 800MSample/s CMOS A/D Converter," *IEEE,* Feb. 9, 2000 (2 pgs).

Krishnaswamy Nagaraj, et al., "A Dual-Mode 700-Msamples/s 6-bit 200-Msamples/s 7-bit A/D Converter in a 0.25- µm Digital CMOS Process," *IEEE* Dec. 12, 2000 (9 pgs).

Govert Geelen, "A 6b 1.1GSample/s CMOS A/D Converter," *IEEE,* Feb. 6, 2001 (3 pgs).

Robert C. Traft et al., "A 100-Ms/s 8-b CMOS Subranging ADC with Sustained Parametric Performance from 3.8 V Down to 2.2 V," *IEEE,* Mar. 2001 (8 pgs).

Naoki Kurosawa et al., "Explicit Analysis of Channel Mismatch Effects in Time-Interleaved ADC Systems," *IEEE,* Mar. 2001 (11 pgs).

Peter Scholtens et al., "A 6b 1.6Gsample/s Flash ADC in O.18 µm CMOS using Averaging Termination," *ISCC,* Feb. 5, 2002 (3 pgs).

Ken Poulton et al., "A 4GSample/s 8b ADC in 0.35 µm CMOS," *ISSCC,* Feb. 5, 2002 (3 pgs).

Po-Hui Yang et al., "Low-Voltage Pulsewidth Control Loops for SOC Applications," *IEEE,* Oct. 2002 (4 pgs).

Shafiq M. Jamal et al., "A 10-b 120-Msample/s Time-Interleaved Analog-to-digital Converter with Digital Background Calibration," *IEEE,* Dec. 12, 2002 (10 pgs).

Ken Poulton et al., "A 20GS/s 8b ADC with a 1MB Memory in 0.18 µm CMOS," *IEEE,* 2003 (10 pgs), no month.

Xicheng Jiang et al., "A 2GS/s 6b ADC in 0.18 µm CMOS," *IEEE,* Feb. 12, 2003 (10 pgs).

Robert Taft et al., A 1.8V 1.6GS/s 8b Self-Calibrating Folding ADC with 7.26 ENOB at Nyquist Frequency, *IEEE,* Feb. 17, 2004 (2 pgs).

Robert C. Taft et al., "A 1.8-V 1.6-GSample/s 8-b Self-Calibrating Folding ADC with 7.26 ENOB at Nyquist Frequency," *IEEE,* Dec. 12, 2004 (9 pgs).

* cited by examiner

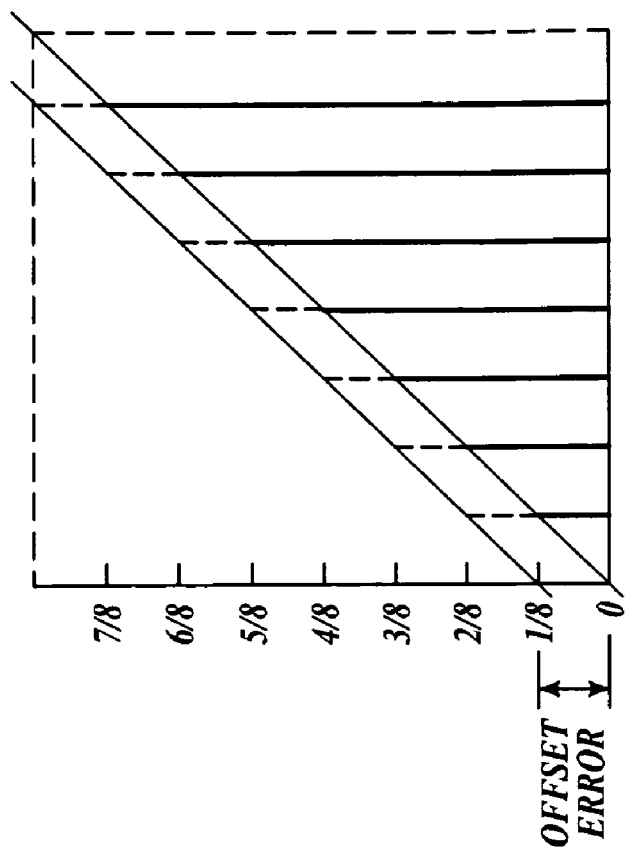
FIG.1B *(PRIOR ART)*
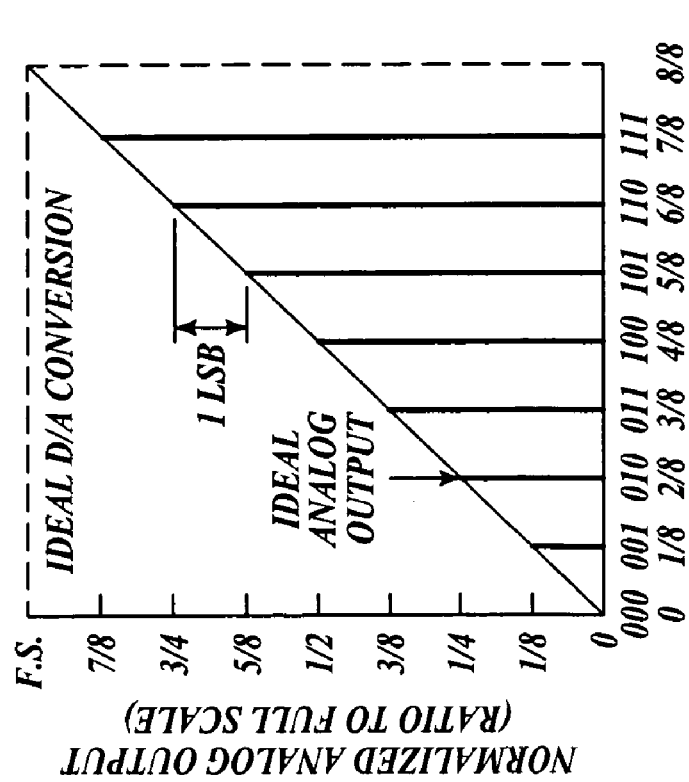
FIG.1A *(PRIOR ART)*

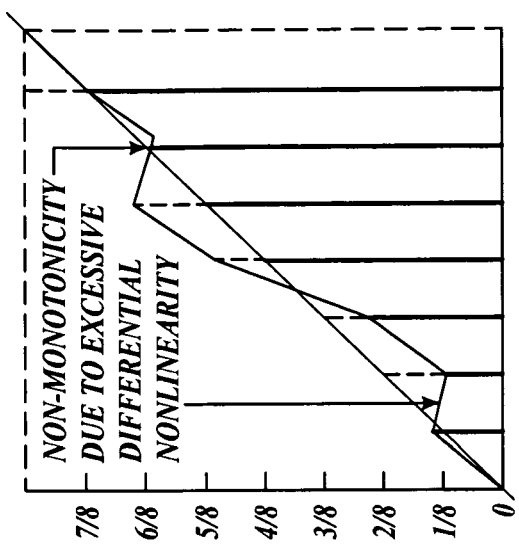
FIG. 1E *(PRIOR ART)*
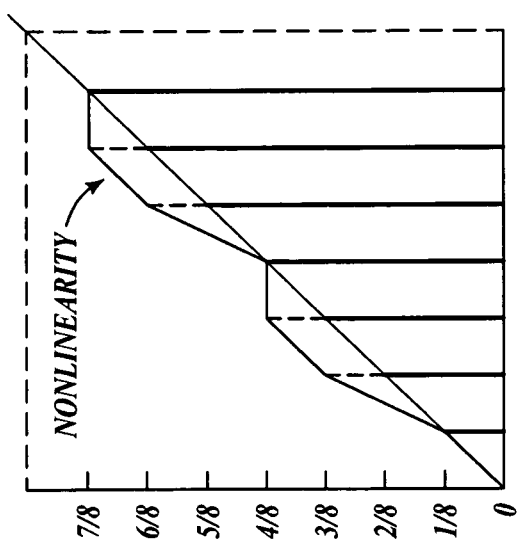
FIG. 1D *(PRIOR ART)*
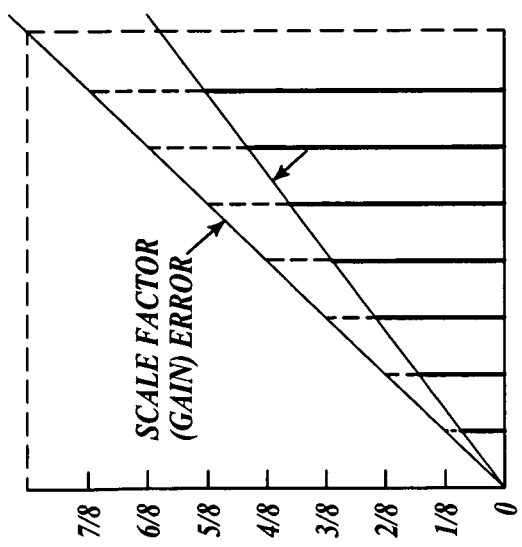
FIG. 1C *(PRIOR ART)*

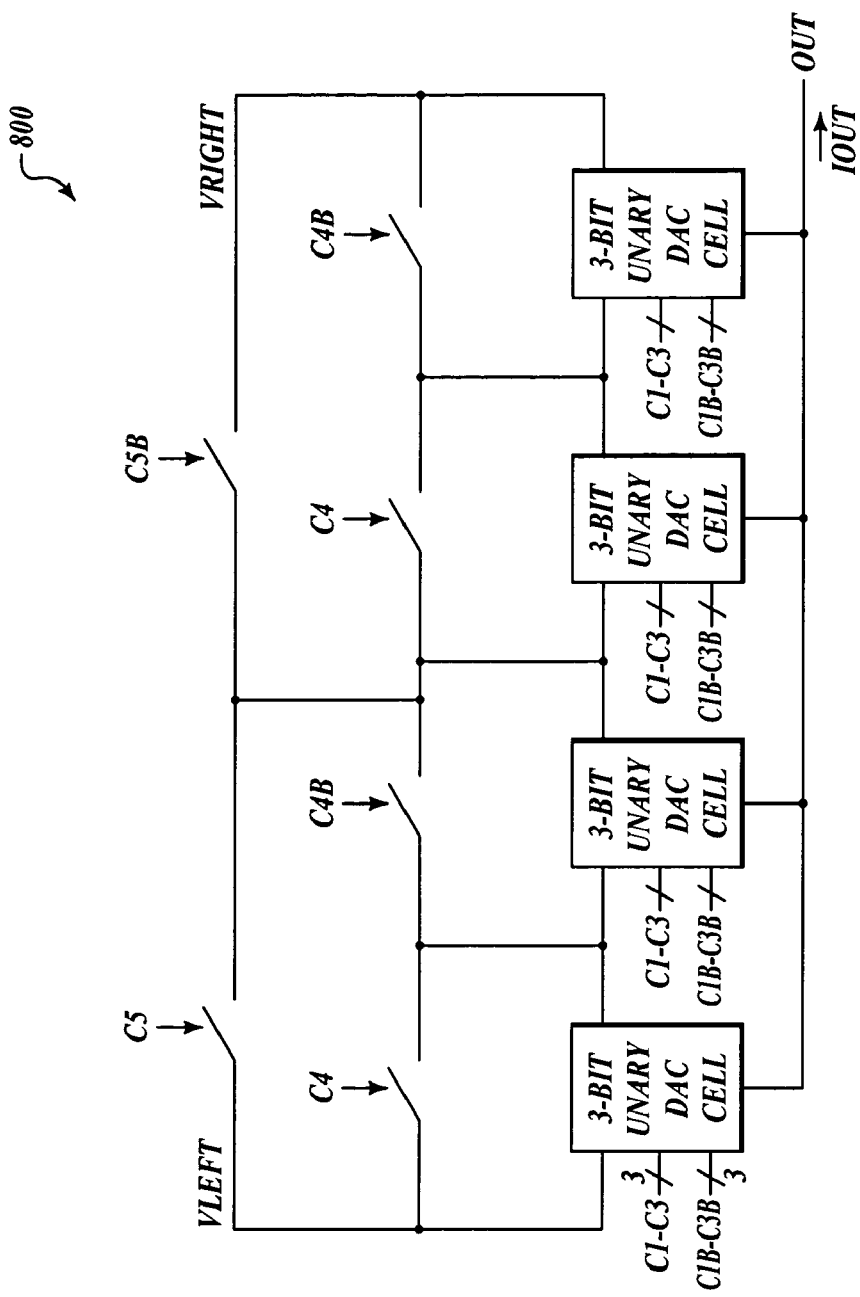
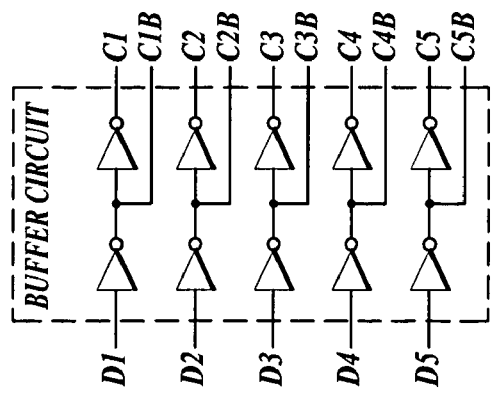
FIG 8.

HIGH-DENSITY MOS-DECODED UNARY DAC

FIELD OF THE INVENTION

The present disclosure generally relates to digital-to-analog converter (DAC) circuits. More particularly, the present disclosure relates to a compact circuit that includes MOS decoders and current sources that are arranged as part of a unary DAC. The compact circuit, or unary cell, can be used as part of a scalable DAC design using segmented, non-segmented, or some other topology that may employ a unary cell.

BACKGROUND

Various digital-to-analog converter (DAC) circuits can be employed to generate analog signals from digital codes. Common DAC circuit topologies generally fall into two basic types: voltage scaled and current scaled. Voltage scaling DAC circuits generate an output voltage based on the division and/or multiplication of a reference voltage. Current scaling DAC circuits generate an output current based on the division and/or multiplication of a reference current. Other DAC circuit topologies also exist that are hybrids of current and voltage scaling topologies.

Each digital code consists of a number (N) of binary bits ($b_1$, $b_2$, ..., $b_N$). The analog output signal (current or voltage) from the DAC corresponds to a particular binary scaling of a full-scale value (FS), where the binary scaling is related to the digital code. The minimum step size for the analog output voltage, between adjacent code words, corresponds to $FS/2^N$ and is referred to as a least significant bit (LSB) of resolution. A typical conversion from the N-bit digital code word to an analog signal (current or voltage) yields the following transfer function:

$$OUT = FS \times \left[ \left(\frac{b_1}{2^1}\right) + \left(\frac{b_2}{2^2}\right) + \ldots + \left(\frac{b_N}{2^N}\right) \right]$$

The above identified equation results in a transfer function with equal step sizes between each adjacent code word, as illustrated by FIG. 1A. However, non-ideal conditions in the DAC implementation may result in non-ideal performance as illustrated by FIGS. 1B–1E. Offset errors are illustrated by FIG. 1B, where the analog voltage associated with each unique binary code has a common offset error for substantially every binary code. Scaling errors (a.k.a. gain errors) are illustrated by FIG. 1C, where the slope of the transfer curve is non-ideal. Linearity errors are illustrated by FIG. 1D, where the slope of the transfer curve changes for at least two adjacent binary codes. Monotonicity errors are illustrated by FIG. 1E, where one or more binary codes yield analog outputs which appear out of sequence.

A binary-weighted current DAC is one topology that includes an array of current sources that are arranged to provide a total output current (Iout) to a load circuit, where the total output current is scaled according to the corresponding digital code. Each current source in the array of current sources is arranged to provide a portion of the total current (Iout) to the load circuit.

The binary-weighted current DAC can be implemented with an array of unequal current sources that are scaled relative to one another to provide the binary weighted currents. The worst code transitions are observed in the transfer function when a single larger current source is activated, and several smaller current sources are deactivated. Non-ideal output current can be observed at these code transitions due to mismatches between the current source elements, resulting in high differential non-linearity (DNL) errors. Mismatches in the relative accuracy of the current sources are often the result of semiconductor processing variations.

A unary current DAC employs a decoder that is arranged to activate unit current sources, all of which have equal value, in sequence as the binary code increases in value. For example, a 9-bit DAC has 512 levels from 0 to 511, where each step corresponds to an additional unit current source. As the binary code increases over the range of the transfer function, additional current sources are activated without deactivating any of the previously active current sources. The unary current DAC provides for excellent linearity, and DNL performance.

Segmented unary DACs employ a combination of techniques for binary weighted DACs and unary DACs. High-order bits are implemented in the unary portion, while low-order bits are implemented in a binary weighted portion. For example, a 9-bit DAC may be implemented as a segmented DAC with bits 1–4 being implemented in a unary fashion, while bits 5–9 may be implemented in a binary fashion. For this example, the unary portion may require 15 unary current sources, while the binary weighted portion may require 5 binary current sources. The segmented unary DAC provides a good tradeoff between the unary and binary-weighted DAC implementations, with overall good DNL and reasonable space requirements (die area).

BRIEF DESCRIPTION OF THE DRAWINGS

Non-limiting and non-exhaustive embodiments are described with reference to the following drawings.

FIGS. 1A–1E are graphs illustrating example performance characteristics for a conventional digital-to-analog converter circuit.

FIG. 8 is a schematic diagram for a 5-bit unary DAC cell that includes a decoder switching arrangement and a set of 3-bit unary DAC cell circuits.

DETAILED DESCRIPTION

Figure 2:
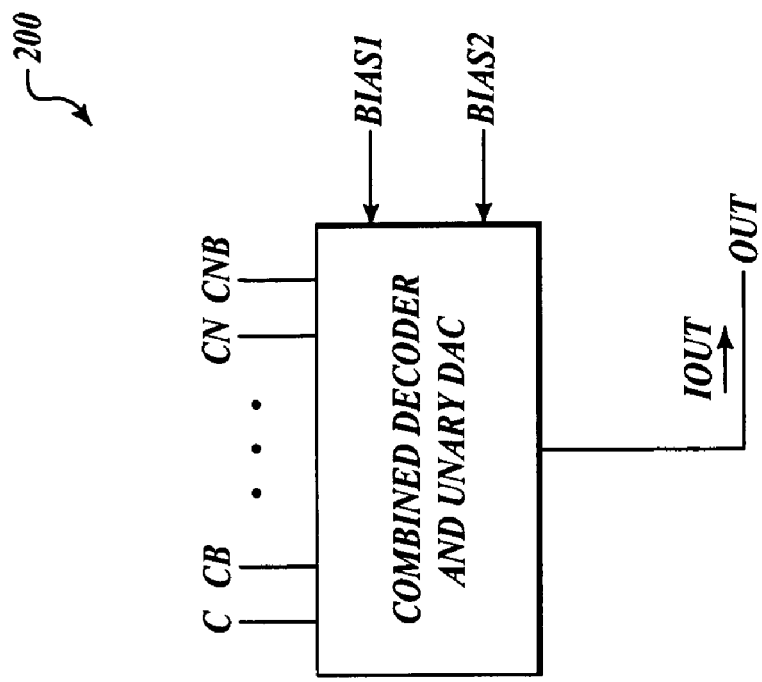
FIG. 2 is a block diagram for an example unary DAC system.

Various embodiments will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electromagnetic, mechanical, logical, or other connection between the items connected, without any electrical, mechanical, logical or other intermediary therebetween. The term "coupled" can mean a direct connection between items, an indirect connection through one or more intermediaries, or communication between items in a manner that may not constitute a connection. The term "circuit" can mean a single component or a plurality of components, active and/or passive, discrete or integrated, that are coupled together to provide a desired function. The term "signal" can mean at least one current, voltage, charge, data, or other such identifiable quantity.

Briefly stated, the present disclosure generally relates to a compact unary DAC cell. Multiple switching circuits and current source circuits are arranged to operate as part of the compact unary DAC cell. The compact unary DAC cell can be combined with additional compact unary DAC cells to provide a scalable unary DAC system that may be segmented, non-segmented, single-ended, differential, or some other DAC topology that may employ one or more unary DAC cells. Each unary DAC cell is preferably comprised of transistors of a single type such that the maximum circuit density can be achieved. The current source circuits may each have equal current magnitudes. The total output current from the unary DAC cell corresponds to the combined currents from each of the current sources that are enabled.

General System Concept

FIG. 2 is a block diagram for an example unary DAC system (200) that is arranged according to at least one feature of the present disclosure. System 200 includes a unary DAC circuit that includes switching circuits to provide decoding of a multi-bit (N) control signals ($C_1$–$C_N$), and their inverses ($C_{1B}$–$C_{NB}$), to provide an output current ($I_{OUT}$). The various control signals ($C_1$–$C_N$ and $C_{1B}$–$C_{NB}$) may be provided by a buffer logic circuit in response to a digital code input signal. A bias circuit may be employed to provide various bias signals (e.g., BIAS1, BIAS2 . . . ) that are utilized by the unary DAC circuit and the various switching circuit.

A unary DAC circuit such as that illustrated in FIG. 2 can be arranged to include a set of decoding/switching circuits that provide for efficient control in the overall DAC circuit. The unary DAC illustrated in FIG. 2 includes multiple unary current source circuits that are arranged to cooperate with a decoding/switching circuit such that each unit current source circuit can be individually controlled. The current sources and decoding/switching circuits are arranged in a compact configuration that has not been previously utilized by conventional unary DAC circuits. DNL errors and the resulting non-monotonicty (e.g., see FIGS. 1D and 1E) errors are avoided by use of the compact unary DAC arrangement. The excellent linearity and monotonicity is achieved by the compact unary DAC arrangement since additional unit current sources are successively enabled without disabling any of the previously enabled unit current sources. The enhanced performance features of the compact unary DAC circuit will be further understood by way of the various example circuits that are described in the present disclosure.

Example 2-Bit Unary DAC Cell

Figure 3:
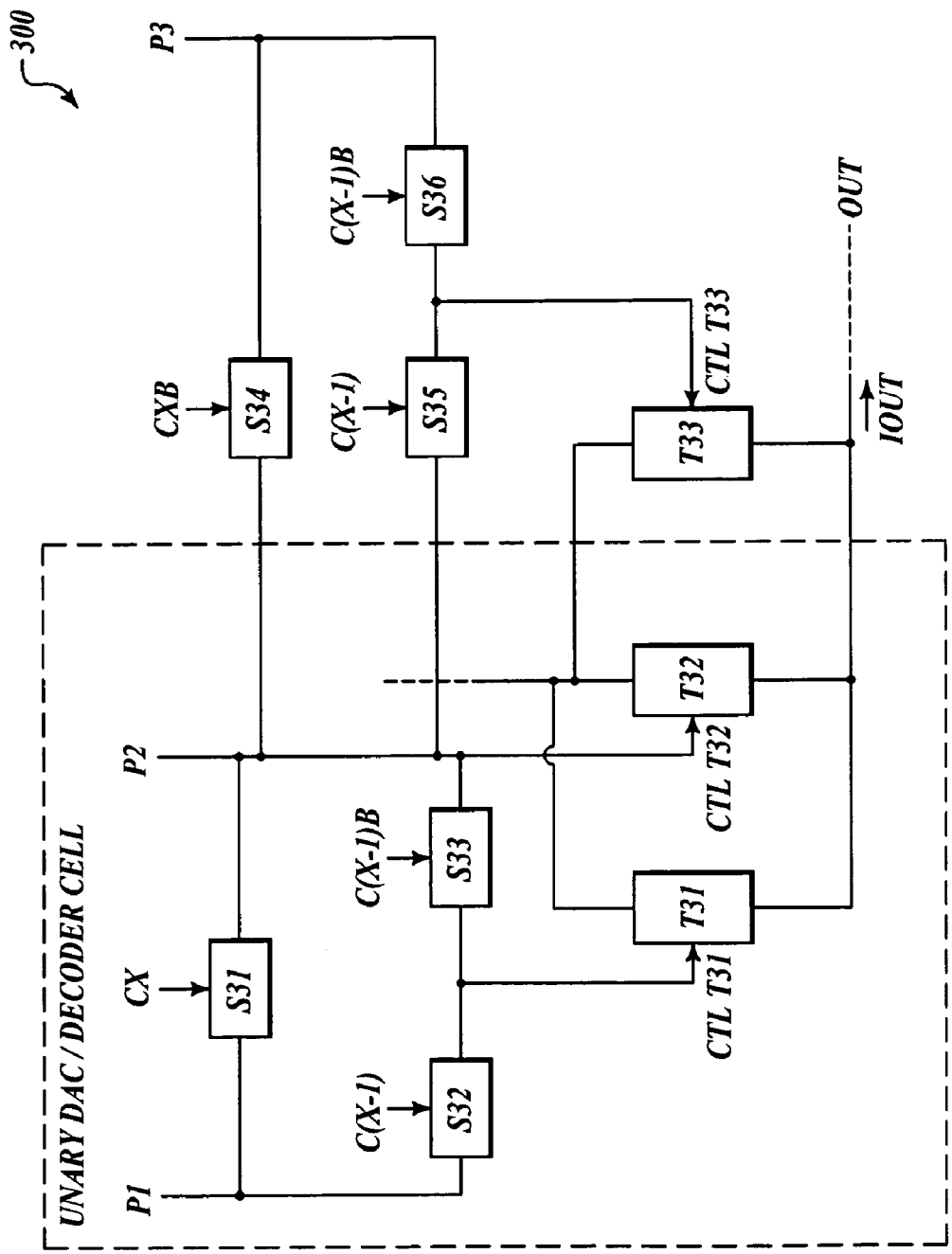
FIG. 3 is a schematic diagram of an example 2-bit unary DAC cell that includes a decoder switching arrangement.

FIG. 3 is a schematic diagram of an example 2-bit unary DAC cell (300) that includes a decoder switching arrangement that may be utilized in a unary DAC system such as that illustrated in FIG. 2. The 2-bit unary DAC cell (300) includes control lines $C_X$, $C_{XB}$, $C_{(X-1)}$, and $C_{(X-1)B}$, a set of switching circuit ($S_{31}$–$S_{36}$), and a set of current sources that may be implemented using transistor circuits ($T_{31}$–$T_{33}$). The variable "X" is associated with a particular control signal based on the number of unary DAC cells that are coupled together in the overall design, as will become apparent upon further reflection of the present disclosure.

Switching circuit $S_{31}$ is arranged to selectively couple two input terminals together ($P_1$ and $P_2$) in response to control signal $C_X$. Switching circuit $S_{32}$ is arranged to selectively couple a first input terminal (e.g., $P_1$) to a first control terminal (e.g., CTL $T_{31}$) for the first current source (e.g., $T_{31}$) in response to control signal $C_{(X-1)}$. Switching circuit $S_{33}$ is arranged to selectively couple a second input terminal (e.g., $P_2$) to the first control terminal (e.g., CTL $T_{31}$) for the first current source (e.g., $T_{31}$) in response to control signal $C_{(X-1)B}$. Switching circuit $S_{34}$ is arranged to selectively couple two input terminals together ($P_2$ and $P_3$) in response to control signal $C_{XB}$. Switching circuit $S_{35}$ is arranged to selectively couple the second of the two input terminals (e.g., $P_2$) to a third control terminal (e.g., CTL $T_{33}$) for the third current source (e.g., $T_{33}$) in response to control signal $C_{(X-1)}$. Switching circuit $S_{36}$ is arranged to selectively couple a third of the input terminals (e.g., $P_3$) to the third control terminal (e.g., CTL $T_{33}$) for the third current source (e.g., $T_{33}$) in response to control signal $C_{(X-1)B}$. The second of the two input terminals (e.g., $P_2$) is also coupled to a second control terminal for the second current source (e.g., CTL $T_{32}$). Control signals $C_{(X-1)}$ and $C_{(X-1)B}$ are inverses of one another such that switching circuits $S_{32}$ and $S_{33}$ are operated with opposite conditions. For example, switching circuit $S_{32}$ is in a closed position when switching circuit $S_{33}$ is in an open position, and vice-versa. Similarly, control signals $C_X$ and $C_{XB}$ are inverses of one another such that switching circuits $S_{31}$ and $S_{34}$ are operated with opposite conditions. The current sources are matched as unit current sources in the overall DAC system.

Switching circuits $S_{31}$–$S_{36}$ are arranged to selectively couple the input terminals to the control terminals. In one example, control signal $C_X$ and $C_{(X-1)}$ are logic 0 signals, and input terminal P3 is coupled to control terminals CTL $T_{31}$–CTL $T_{33}$.via switching circuits $S_{33}$, $S_{34}$ and $S_{36}$. In another example, control signal $C_X$ is a logic 0 signal and control signal $C_{(X-1)}$ is a logic 1 signal, input terminal P1 is coupled to control terminal CTL $T_{31}$ via switching circuit $S_{32}$, and input terminal P3 is coupled to control terminals CTL $T_{32}$ and CTL $T_{33}$ via switching circuits $S_{34}$ and $S_{35}$. In yet another example, control signal $C_X$ is a logic 1 signal and control signal $C_{(X-1)}$ is a logic 0 signal, input terminal P1 is coupled to control terminals CTL $T_{31}$, and CTL $T_{32}$ via switching circuits $S_{31}$ and $S_{33}$, and input terminal P3 is coupled to control terminal CTL $T_{33}$ via switching circuit $S_{36}$. In still another example, control signal $C_X$ and $C_{(X-1)}$ are logic 1 signals, and input terminal P1 is coupled to control terminals CTL $T_{31}$–CTL $T_{33}$ via switching circuits $S_{31}$, $S_{32}$ and $S_{35}$.

Input terminals $P_1$ and $P_3$ may be separately coupled to one of: a digital control signal, an analog control signal, a biasing voltage, a biasing current, a power supply voltage, or some other voltage that can be used as a control signal by the current source circuits. The current source circuits may be arranged as selectable transistor circuits that are responsive to the control signals that are provided to the input terminals. In one example, each current source circuit includes a transistor that is enabled by a biasing signal that is provided to one of the input terminals and disabled by a power signal that is provided to the other input terminal. In another example, each current source circuit includes a transistor that is biased by a biasing signal, and a switching circuit that is arranged to cooperate with the transistor for selective operation (e.g., a series switch that interrupts current flow from the transistor, a selectively biased cascode transistor, a switch that disabled the biasing of the transistor, etc.).

The 2-bit unary DAC cell includes a minimum set of components that can be scaled to build an N-bit unary DAC as denoted by the dotted line labeled unary DAC cell. The unary DAC cell comprises three of the switching circuits ($S_{31}$–$S_{33}$), and two current source circuits ($T_{31}$, $T_{32}$). Multiple unary DAC cells can be coupled together in a left to right or right to left fashion to build the N-bit unary DAC. Adding switching circuits are necessary to selectively couple together the unary DAC cells to provide the N-bit unary DAC system. This will become more apparent from the examples provided with respect to FIGS. 7A, 7B, 8 and 9.

Additional Example 2-Bit Unary DAC Cells

Figure 4:
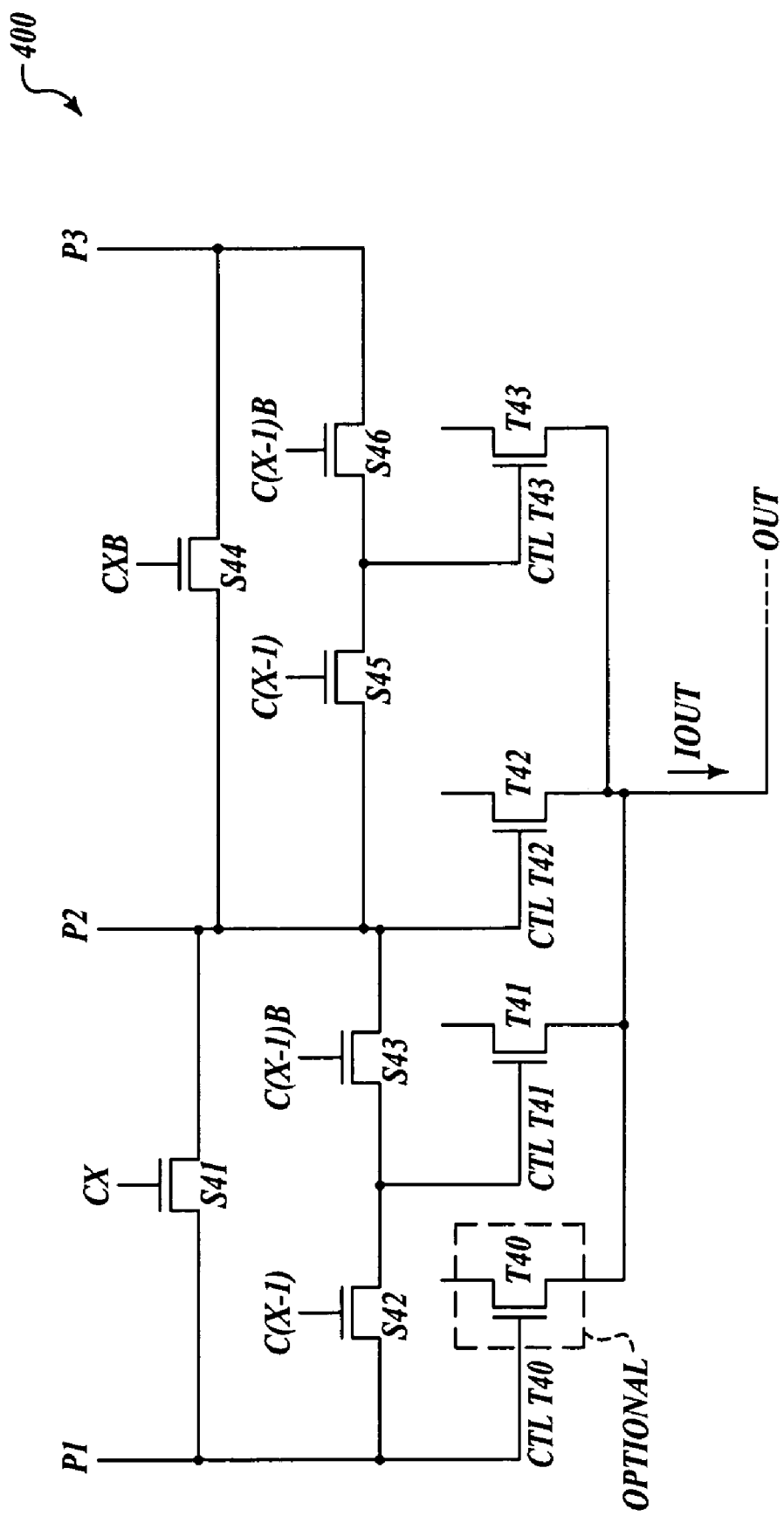
FIG. 4 is a schematic diagram of another example 2-bit unary DAC cell that includes a decoder switching arrangement.

FIG. 4 is a schematic diagram of another example 2-bit unary DAC cell (400) that includes a decoder switching arrangement that is arranged similar to that described with respect to FIG. 3. In FIG. 4, the previously described current sources and switching circuits from FIG. 3 are implemented with NMOS type transistor devices. An additional transistor current source is illustrated in FIG. 4 that is an optional portion of the unary DAC.

Figure 5:
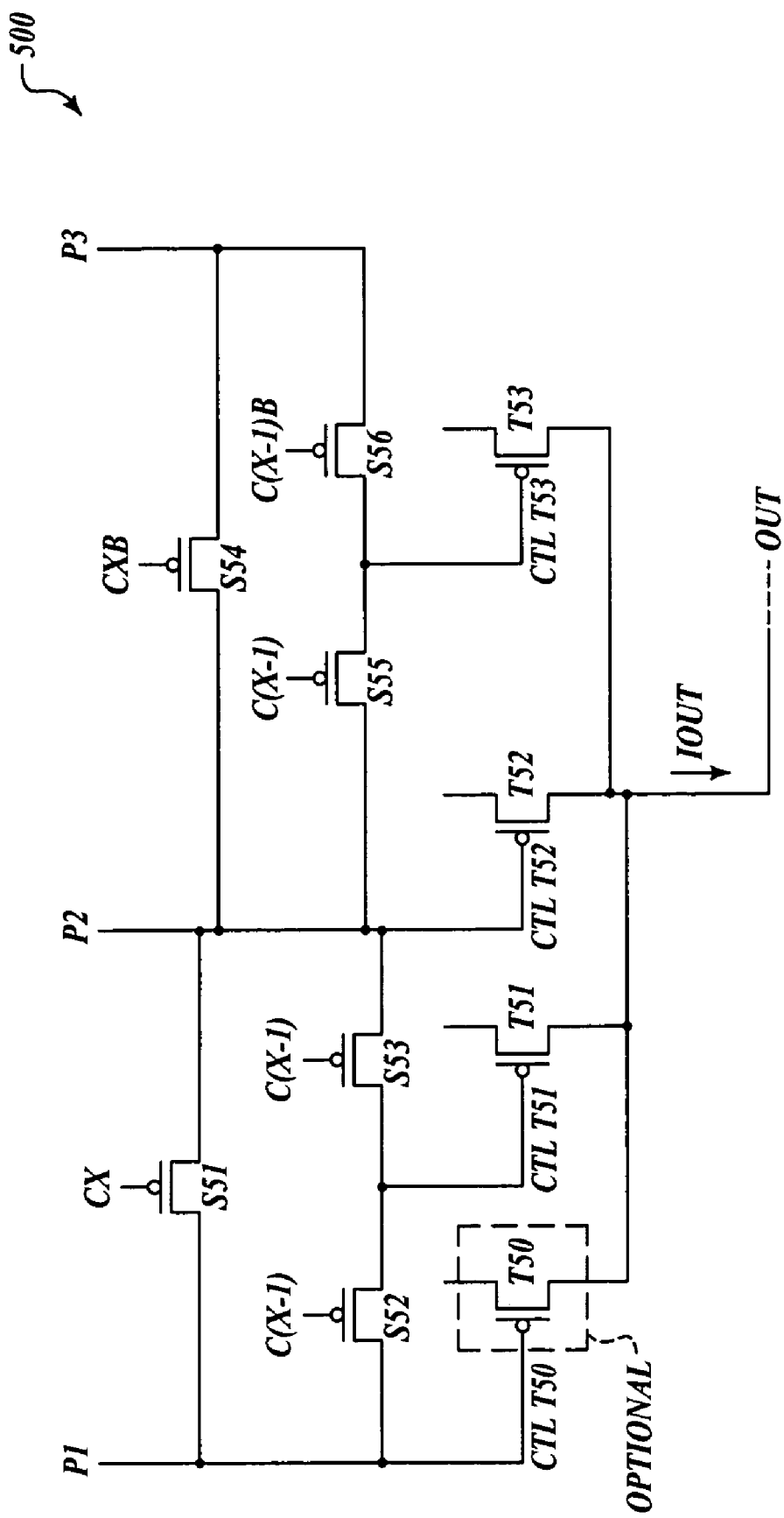
FIG. 5 is a schematic diagram of yet another example 2-bit unary DAC cell that includes a decoder switching arrangement.

FIG. 5 is a schematic diagram of yet another example 2-bit unary DAC cell (500) that is substantially similar to that described with respect to FIG. 4, except that the NMOS type transistor devices are replaced with PMOS type transistor devices.

Figure 6:
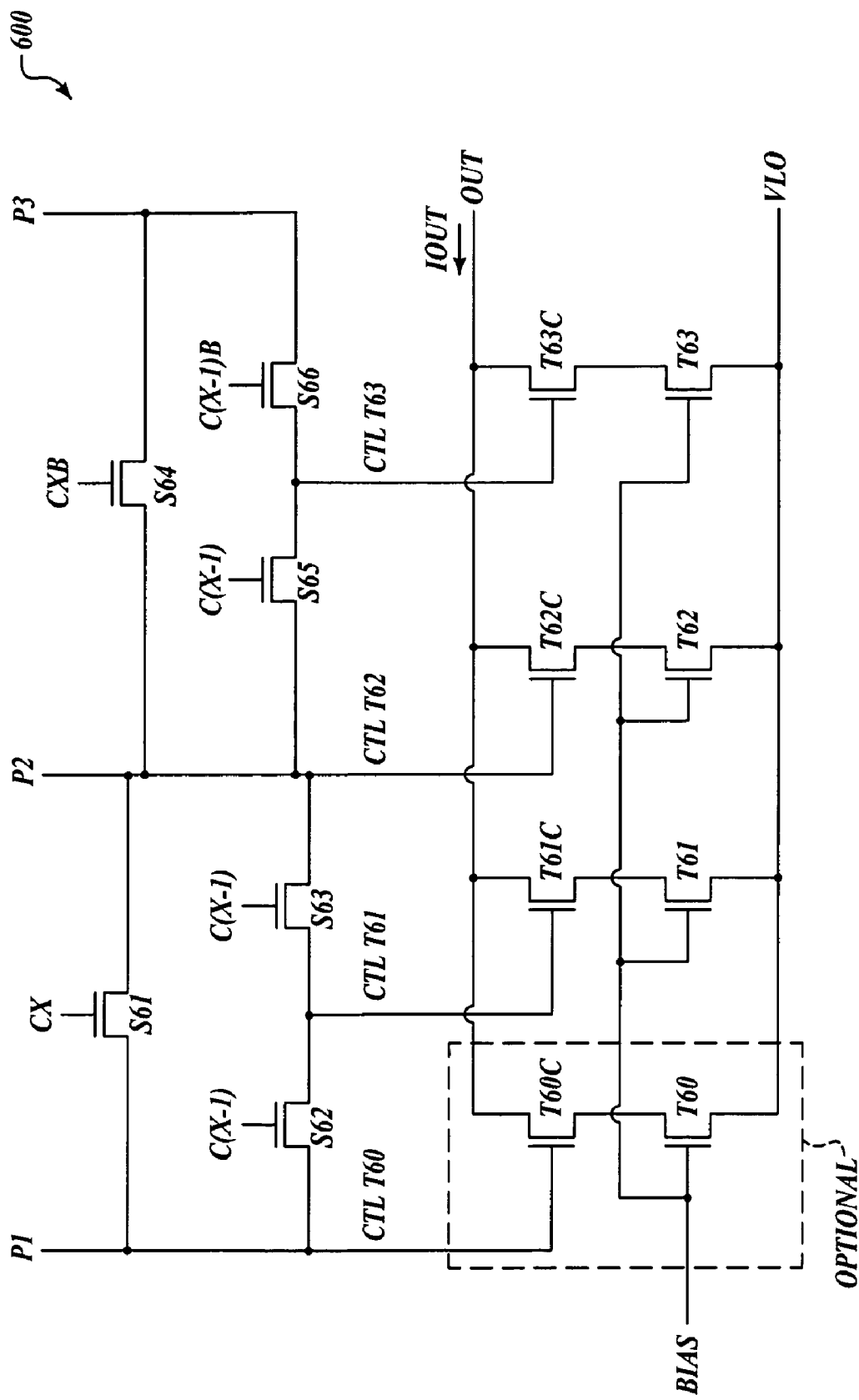
FIG. 6 is a schematic diagram for still another example 2-bit unary DAC cell that includes a decoder switching arrangement.

FIG. 6 is a schematic diagram of still another example 2-bit unary DAC cell (600) that is substantially similar to that described with respect to FIG. 4, except that each of the current sources are replaced with series coupled transistor devices. The series coupled transistor devices can either be series coupled cascode transistors, or series switching cascode transistors, or resistively biased transistors for source degeneration or current limiting applications.

In a binary weighted current DAC, a series of binary weighted current sources are selectively coupled together via series switching circuits to provide an overall output current that corresponds to the binary scaled quantity. Each of the current sources is arranged to provide a current that is binary weighted (e.g., 1x, 2x, 4x, 8x, 16x . . . ). Binary weighted current sources are commonly designed using scaled devices, or multiple unit devices that are coupled together in parallel. Since a very large amount of area is required for a high precision DAC, the device sizes for each scaled current source is maintained as small as possible. Small devices exhibit poor matching qualities such that large DNL errors and non-monotonicty qualities are exhibited at the major code transitions. Matching performance can be improved by larger devices since matching improves by the square root of the device area according to Pelgrom's rule.

A conventional unary DAC topology is an improvement over the conventional binary current DAC approach in that matching errors between each unit sized current source is minimal. A conventional unary DAC employs a series switch between each of the unit sized current sources and the output node where the currents are summed together. Since the series switch devices have finite on-resistance and parasitic capacitance characteristics, the physical sizes and layout of the switching devices are critical. Moreover, conventional unary DAC circuits use CMOS type logic to accomplish the decoder, which comprises a substantial amount of circuit area.

The present disclosure identifies limitations and problems of conventional unary DAC circuits as well as binary DAC circuits, and provides for a compact switching circuit in the unary DAC cell that does not employ CMOS logic. The described unary DAC circuits provide for: excellent DNL performance, excellent monotonicty, reasonable integral non-linearity errors, a binary digital interface with minimal use of routing area, and a full decoder circuit with minimal die area when compared with conventional circuits. Minimal device sizes can be used for the decoding logic since the output currents are not switched (only the control signals to the current sources). Minimal current source device sizes can be used since a unary topology is employed, providing excellent DNL and monotonicity. Since a single transistor type can be used for the current sources and the decoder logic, instead of CMOS type logic, the density of the physical die layout can be very high. This is because PMOS and NMOS devices need a certain minimum spacing in the physical layout due to manufacturing limitations. The unary DAC topology can be implemented as a number of unary DAC cells that are coupled together in a switching matrix, or as a segmented architecture that includes a unary DAC cell topology.

Example 3-Bit Unary DAC Cell

Figure 7A:
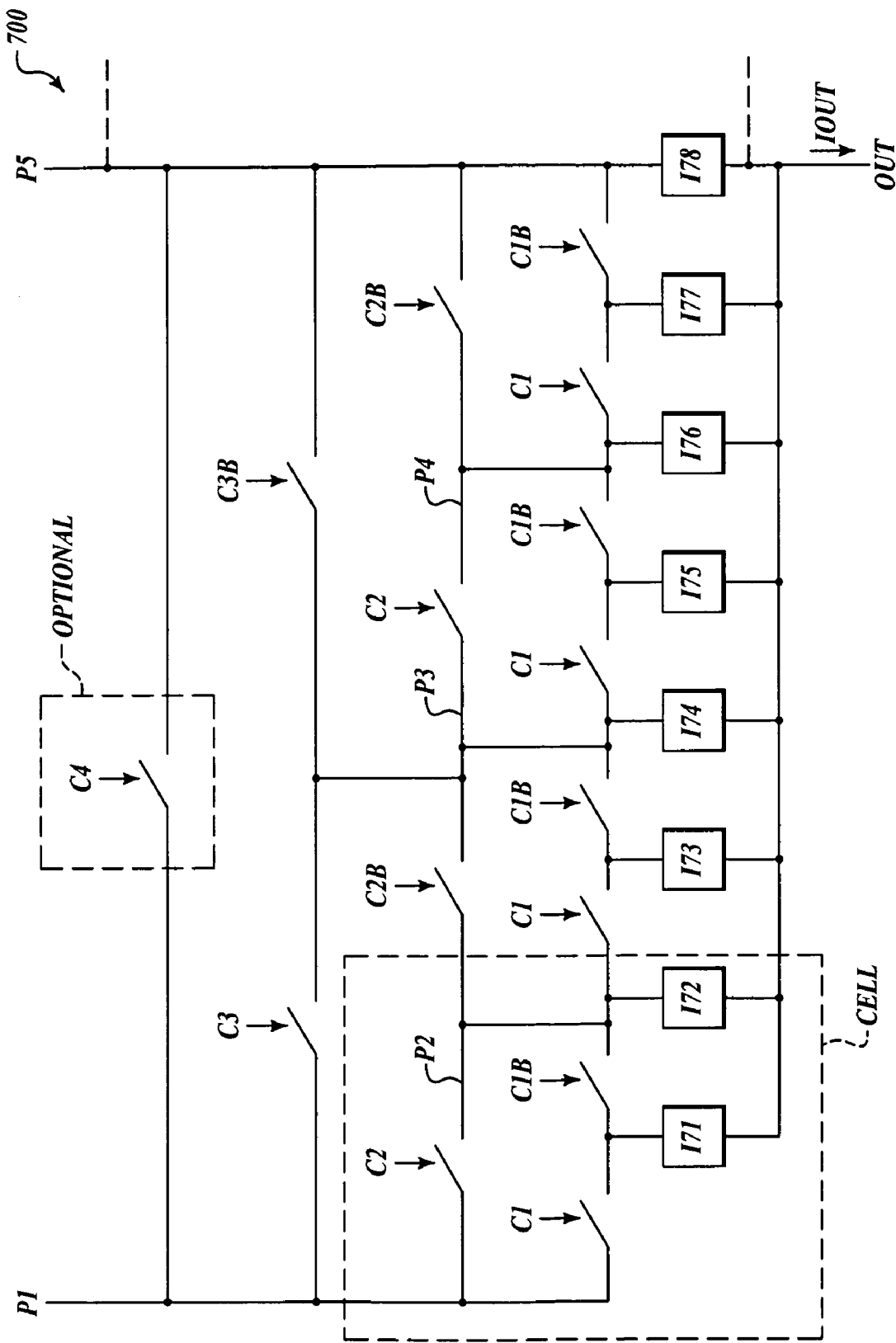
FIGS. 7A and 7B are schematic diagrams for a 3 or 4-bit unary DAC cell that includes a decoder switching arrangement.

FIG. 7A is a schematic diagram for a 3-bit unary DAC cell (700) that includes a decoder switching arrangement that may be utilized in a unary DAC system such as that illustrated in FIG. 2. The 3-bit unary DAC cell (700) includes control lines $C_1$–$C_3$ and $C_{1B}$–$C_{3B}$, a set of switching circuit, and a set of current sources ($I_{71}$–$I_{78}$) that may be implemented using transistor circuits such as that described in the previous examples. Input terminals $P_1$ and $P_5$ can be selectively coupled to each of the control terminals for the current sources ($I_{71}$–$I_{78}$) in response to the various control signals. Four of the unary DAC cell arrangements that were previously described may be arranged with additional switching circuits to operate as part of the 3-bit unary DAC cell (700) as is illustrated by the doted area in FIG. 7A.

FIG. 7A includes current source $I_{78}$ as coupled to input terminal P5 such that current source $I_{78}$ is always active. For this example, the decoding switches are arranged to selectively activate current sources $I_{71}$–$I_{77}$. When each of the current sources provides a unit current of 1X, the total range of output currents is from 1X through 8X. In another example circuit, current source $I_{78}$ is eliminated (e.g., see FIG. 7B) and the remaining current sources each provide a unit current of 1X, yielding a total range of output currents from 0 through 7X.

Example 4-Bit Unary DAC Cell

Two of the 3-bit Unary DAC cells can be combined to provide for a 4-bit unary DAC cell. For example, the circuit of FIG. 7A can be combined with the circuit of FIG. 7B with additional switching circuits (see optional doted line switching circuits) that are responsive to control signals $C_4$ and $C_{4B}$.

In one example, input terminal $P_1$ is coupled to a biasing signal and input terminal $P_9$ is coupled to a ground signal (or low power signal). For this example, the biasing signal is used to selectively enable current sources through the switching decoder logic based on the control signals, or the ground signal is used to selectively disable current sources. When all of the control signals are low ($C_1$–$C_4$=logic 0 and $C_{1B}$–$C_{4B}$=logic 1) then none of the current sources are on. When only control signal $C_1$ corresponds to logic 1, then current source $I_{71}$ is biased active and the remaining current sources are disabled. When only control signal $C_2$ corresponds to logic 1, then current sources $I_{71}$, and $I_{72}$ are biased active and the remaining current sources are disabled. When only control signal $C_3$ corresponds to logic 1, then current sources $I_{71}$, $I_{72}$, $I_{73}$, and $I_{74}$ are biased active and the remaining current sources are disabled. This pattern repeats so that one current source is added at a time, until all 16 are on with control signals $C_1$–$C_4$ corresponding to logic 1. The pattern can be further expanded to accommodate any desired size DAC.

Example 5-Bit Unary DAC Cell

Figure 7B:
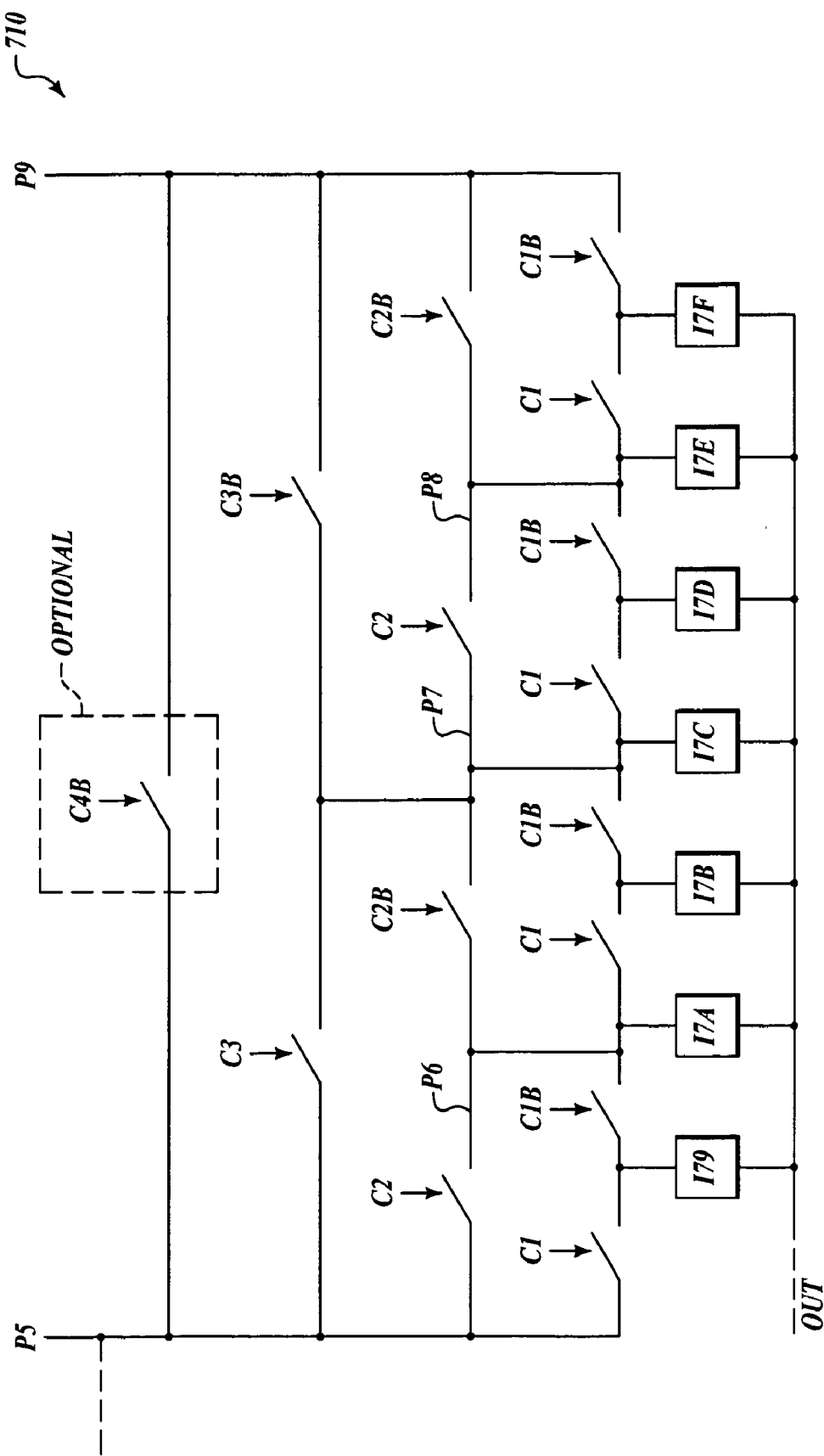

FIG. 8 is a schematic diagram for a 5-bit unary DAC cell that includes a decoder switching arrangement and a set of four 3-bit unary DAC cell circuits. Two of the 3-bit Unary DAC cells can be combined to provide for a 4-bit unary DAC cell as illustrated in the combination of FIGS. 7A and 7B, while two additional 3-bit Unary DAC cells can be further arranged to provide for another 4-bit unary DAC cell to result in the circuit implemented in FIG. 8. Note that the control line signals for the 3-bit unary DAC cells are control signals $C_1$–$C_3$ and $C_{1B}$–$C_{3B}$, while the control lines for the higher level switching circuits are $C_4$–$C_5$ and $C_{4B}$–$C_{5B}$. An example buffer circuit is comprised of a set of inverter circuits that provide the control lines from a set of data lines ($d_1$–$d_5$).

Example Differential Unary DAC Cell

Figure 9:
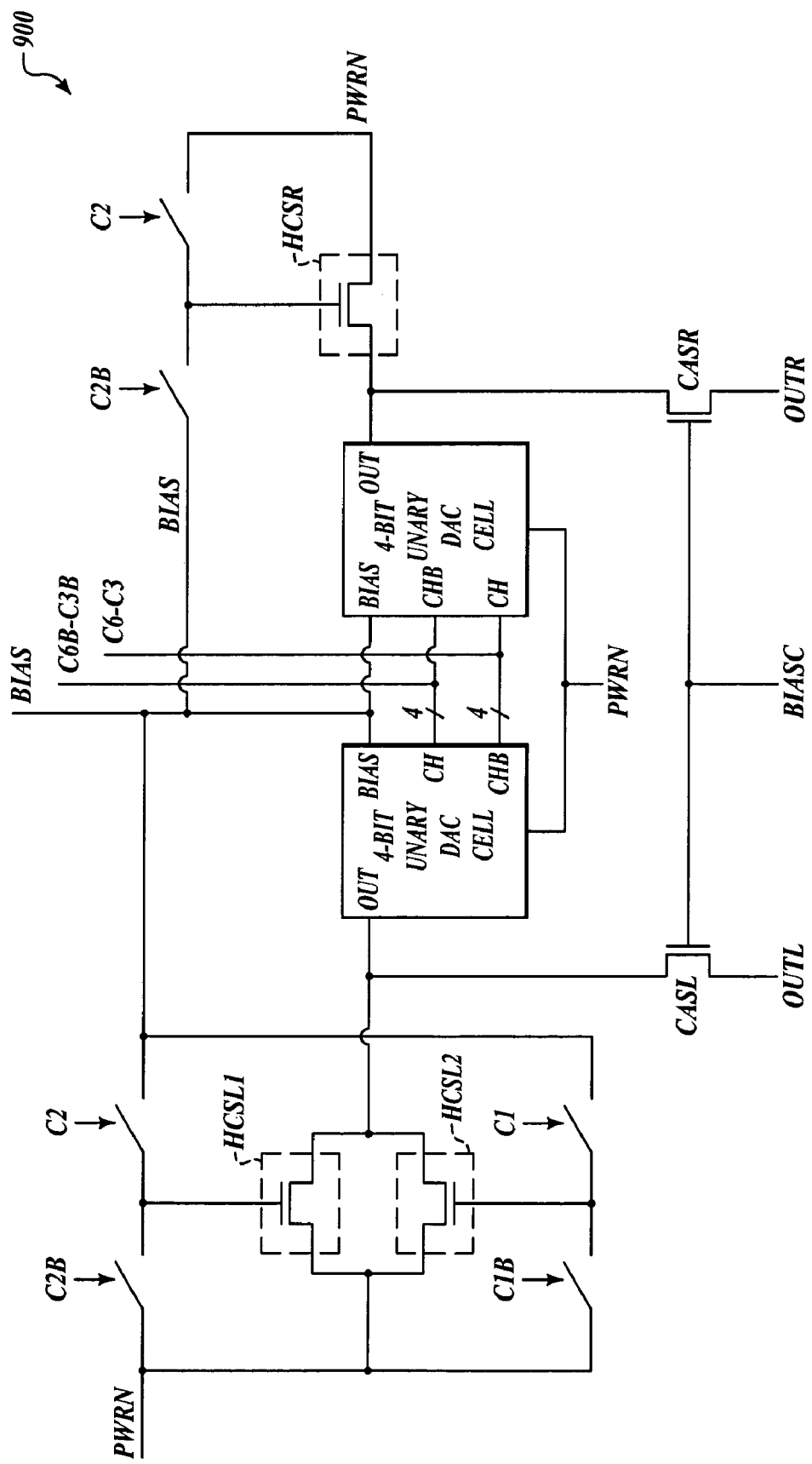
FIG. 9 is a schematic diagram for a differential 5-bit unary DAC cell that includes a decoder switching arrangement and a set of 4-bit unary DAC cells, arranged in accordance with at least one feature of the present disclosure.

FIG. 9 is a schematic diagram for a differential unary DAC cell that includes a decoder switching arrangement and a set of 4-bit unary DAC cell circuits. The differential outputs are provided at terminals OUTL and OUTR, which are coupled from the outputs of the 4-bit unary DAC cells through cascode transistors (CASR, CASL) that are biased by signal BIASC.

Optionally, the unary DAC cell topology can be segmented with additional switching circuit and transistors. For example, ½ unit sized current sources (see e.g., HCSR, HCSL1 and HCSL2) can be used to provide an offset of +/− 5 uA on when unit current sources are sized for 10 uA of current under normal operation. Other arrangements are also possible such as a non-equal offset of 2 half current sources on one side (e.g., left), while an offset of 1 half current source is on the other side (e.g., right).

High-Density NMOS-Decoded Unary DAC circuits can be achieved with the simple switching arrangements that are described above. Switching circuit device sizes can be minimized by selectively changing the control signals for the current source circuits (e.g., the gate of the current source devices, the gate of the cascode devices, or disabling the biasing to the transistors) rather than switching the output of the current sources. Since the gate terminals of MOS transistors have a very high impedance, MOS transistor based current source circuits can be used with minimally sized MOS based switching logic. Moreover, the densities of the unary DAC circuits that include the switching logic can be very high since a single type of MOS device (e.g., N or P but not both) is used instead of CMOS style switching logic. Unary DAC cells can be combined to provide higher order DAC circuits, segmented DAC circuits, differential DAC circuits as well as other variations.

Although the invention has been described herein by way of exemplary embodiments, variations in the structures and methods described herein may be made without departing from the spirit and scope of the invention. For example, the positioning of the various components may be varied. Individual components and arrangements of components may be substituted as known to the art. Since many embodiments of the invention can be made without departing from the spirit and scope of the invention, the invention is not limited except as by the appended claims.

What is claimed is:

1. An apparatus for converting a digital input signal to an output current at an output terminal, the apparatus comprising:

a first transistor circuit that is arranged to operate as a first current source that is selectively enabled via a first control terminal, wherein: the first transistor circuit is comprised of a single transistor type, and a first current from the first transistor circuit is coupled to the output terminal when the first transistor circuit is enabled;

a second transistor circuit that is arranged to operate as a second current source that is selectively enabled via a second control terminal, wherein: the second transistor circuit is comprised of the single transistor type, a second current from the second transistor circuit is coupled to the output terminal when the second transistor circuit is enabled, and a magnitude associated with the first current is substantially matched to a magnitude associated with the second current;

a first switching circuit that is arranged to selectively couple a first input terminal to the first control terminal in response to a first control signal, wherein the first switching circuit is comprised of the single transistor type;

a second switching circuit that is arranged to selectively couple a second input terminal to the first control terminal in response to a second control signal that is an inverse of the first control signal, wherein the second switching circuit is comprised of the single transistor type; and a third switching circuit that is arranged to selectively couple the first input terminal to the second input terminal in response to a third control signal, wherein: the second input terminal is coupled to the second control terminal, and the third switching circuit is comprised of the single transistor type.

2. The apparatus of claim 1, further comprising a buffer logic circuit that is arranged to provide the first, second, and third control signals in response to the digital input signal.

3. The apparatus of claim 1, wherein the single transistor type corresponds to one of: an n-type transistor, a p-type transistor, an NMOS type transistor, and a PMOS type transistor.

4. The apparatus of claim 1, wherein each of the transistor circuits comprises at least one of: a first current source type that is biased by a bias signal that is provided from the corresponding control terminal, a second current source type that includes a series switching transistor that is selectively enabled by a control signal that is provided to the corresponding control terminal, a third current source type that includes a series coupled transistor that is selectively biased by a cascode bias signal that is provided from the corresponding control terminal, and a fourth current source type that includes a series coupled transistor that is selectively biased by a power signal that is provided from the corresponding control terminal.

5. The apparatus of claim 1, further comprising: a third transistor circuit that is arranged to operate as a third current source that is selectively enabled via a third control terminal, wherein: the third transistor circuit is comprised of the single transistor type, a third current from the third transistor circuit is coupled to the output terminal when the third transistor circuit is enabled, a magnitude associated with the third current is substantially matched to a magnitude associated with the first current, and the third control terminal is coupled to the first input terminal.

6. The apparatus of claim 1, wherein the output current corresponds to at least one of: a single output current from a unary DAC, a differential output current from a unary DAC, a single output current from a segmented unary DAC, and a differential output current from a segmented unary DAC.

7. The apparatus of claim 1, further comprising:
a third transistor circuit that is arranged to operate as a third current source that is selectively enabled via a third control terminal, wherein: the third transistor circuit is comprised of the single transistor type, a third current from the third transistor circuit is coupled to the output terminal when the third transistor circuit is enabled, and a magnitude associated with the third current is substantially matched to the magnitude of the first current;
a fourth transistor circuit that is arranged to operate as a fourth current source that is selectively enabled via a fourth control terminal, wherein: the fourth transistor circuit is comprised of the single transistor type, a fourth current from the fourth transistor circuit is coupled to the output terminal when the second transistor circuit is enabled, and a magnitude associated with the fourth current is substantially matched to the magnitude associated with the first current;
a fourth switching circuit that is arranged to selectively couple the second input terminal to the third control terminal in response to the first control signal, wherein the fourth switching circuit is comprised of the single transistor type;
a fifth switching circuit that is arranged to selectively couple a third input terminal to the third control terminal in response to the second control signal, wherein the fifth switching circuit is comprised of the single transistor type; and
a sixth switching circuit that is arranged to selectively couple the second input terminal to the third input terminal in response to a fourth control signal that is an inverse of the third control signal, wherein: the third input terminal is coupled to the fourth control terminal, and the sixth switching circuit is comprised of the single transistor type.

8. The apparatus of claim 7, further comprising a seventh switching circuit that is arranged to selectively couple the first input terminal to the third input terminal in response to a fifth control signal.

9. An apparatus for converting a digital input signal to an output current at an output terminal, comprising:

a first unary DAC cell that includes a first input terminal, a second input terminal, and a first control terminal, wherein the first unary DAC cell is arranged to provide a first current in response to a control signal that is received at the first control terminal;
a second unary DAC cell that includes a third input terminal, a fourth input terminal, and a second control terminal, wherein the second unary DAC cell is arranged to provide a second current in response to the control signal that is received at the second control terminal;
a third unary DAC cell that includes a fifth input terminal, a sixth input terminal, and a third control terminal, wherein the third unary DAC cell is arranged to provide a third current in response to the control signal that is received at the third control terminal;
a fourth unary DAC cell that includes a seventh input terminal, an eighth input terminal, and a fourth control terminal, wherein the third unary DAC cell is arranged to provide a fourth current in response to the control signal that is received at the fourth control terminal, and wherein the first, second, third, and fourth currents are combined to provide at least a portion of the output current at the output terminal;
a first input signal that is coupled to the first input terminal;
a second input signal that is coupled to the eighth input terminal;
a first switching circuit that is arranged to selectively couple the first input signal to the second and third input terminals in response to a second control signal;
a second switching circuit that is arranged to selectively couple the second and third input terminals to the fourth and fifth input terminals in response to an inverse of the second control signal;
a third switching circuit that is arranged to selectively couple the fourth and fifth input terminals to the sixth and seventh input terminals in response to the second control signal;
a fourth switching circuit that is arranged to selectively couple the sixth and seventh input terminals to the eighth input terminal in response to the inverse of the second control signal;
a fifth switching circuit that is arranged to selectively couple the first input signal to the fourth and fifth input terminals in response to a third control signal;
a sixth switching circuit that is arranged to selectively couple the second input signal to the fourth and fifth input terminals in response to an inverse of the third control signal.

10. The apparatus of claim 9, wherein the first control signal corresponds to one of: a set of control signals, a set off inverse control signals, and a set of control signals and their corresponding inverses.

11. The apparatus of claim 9, wherein the first, second, third, fourth, fifth and sixth switching circuit each correspond to a transistor circuit that is arranged with transistors of a single type.

12. The apparatus of claim 9, wherein the first, second, third, and fourth unary DAC cells each comprise one of: a 2-bit unary DAC cell, a 3-bit unary DAC cell, a 4-bit unary DAC cell, a 5-bit unary DAC cell, and an N-bit unary DAC cell.

13. The apparatus of claim 9, wherein the first, second, third, and fourth unary DAC cells are matched to one another, each of the unary DAC cells comprising:

a first transistor circuit that is arranged to operate as a first current source that is selectively enabled via a first control port, wherein: the first transistor circuit is comprised of a single transistor type;

a second transistor circuit that is arranged to operate as a second current source that is selectively enabled via a second control port, wherein a magnitude associated with the first current is substantially matched to a magnitude associated with the second current;

a first switch circuit that is arranged to selectively couple an input terminal of the unary DAC cell to the first control port in response to a first unary DAC control signal; and a second switch circuit that is arranged to selectively couple a second input terminal of the unary DAC cell to the first control port in response to a second unary DAC control signal that is an inverse of the first unary DAC control signal.

14. The apparatus of claim 13, wherein the first transistor circuit, second transistor circuit, first switch circuit, and second switch circuit are comprised of transistors of a single type.

15. The apparatus of claim 9, wherein the first, second, third, and fourth unary DAC cells are matched to one another, each of the unary DAC cells comprising:

a first transistor circuit that is arranged to operate as a first current source that is selectively enabled via a first control port, wherein: the first transistor circuit is comprised of a single transistor type;

a second transistor circuit that is arranged to operate as a second current source that is selectively enabled via a second control port, wherein the second transistor circuit is comprised of the single transistor type;

a third transistor circuit that is arranged to operate as a third current source that is selectively enabled via a third control port, wherein: the third transistor circuit is comprised of the single transistor type, and a magnitude associated with the first, second, and third currents are substantially matched to one another;

a first switch circuit that is arranged to selectively couple an input port of the unary DAC cell to the first control port in response to a first unary DAC control signal;

a second switch circuit that is arranged to selectively couple the first control port to the second control port in response to a first inverse unary DAC control signal;

a third switch circuit that is arranged to selectively couple the second control port to the third control port in response to the first unary DAC control signal;

a fourth switch circuit that is arranged to selectively couple a second input port of the unary DAC cell to the third control port in response to the first inverse unary DAC control signal;

a fifth switch circuit that is arranged to couple the first input port of the unary DAC cell to the second control port in response to a second unary DAC control signal; and a sixth switch circuit that is arranged to couple the second input port of the unary DAC cell to the second control port in response to an inverse of the second unary DAC control signal.

16. The apparatus of claim 13, wherein the first transistor circuit, second transistor circuit, third transistor circuit, first switch circuit, second switch circuit, third switch circuit, fourth switch circuit, and fifth switch circuit are comprised of transistors of a single type.

17. An apparatus for converting a digital input signal to an output current at an output terminal, comprising:

a first current source means that includes a first control terminal, wherein the first current source means is arranged to provide a first current when enabled via the first control terminal;

a second current source means that includes a second control terminal, wherein the second current source means is arranged to provide a second current when enabled via the second control terminal;

a third current source means that includes a third control terminal, wherein the third current source means is arranged to provide a third current when enabled via the third control terminal;

a means for combining the first, second, and third currents to provide at least a portion of the output current;

a first switching means that is arranged to selectively couple a first input terminal to the first control terminal in response to a first control signal;

a second switching means that is arranged to selectively couple the first control terminal to the second control terminal in response to an inverse of the first control signal;

a third switching means that is arranged to selectively couple the second control terminal to the third control terminal in response to the first control signal;

a fourth switching means that is arranged to selectively couple a second input terminal to the third control terminal in response to the inverse of the first control signal;

a fifth switching means that is arranged to selectively couple the first input terminal to the second control terminal in response to a second control signal; and a sixth switching means that is arranged to selectively couple the second input terminal to the second control terminal in response to an inverse of the second control signal.

18. The apparatus of claim 17, wherein the first current source means, second current source means, third current source means, first switching means, second switching means, third switching means, fourth switching means, fifth switching means, and sixth switching means are comprised of transistors of a single type.

19. The apparatus of claim 17, wherein the first, second, and third currents have substantially the same magnitude.

20. The apparatus of claim 17, wherein the output current corresponds to one of two output currents that are associated with a differential output current.

* * * * *

UNITED STATES PATENT AND TRADEMARK OFFICE
CERTIFICATE OF CORRECTION

PATENT NO.         : 7,068,194 B1
APPLICATION NO. : 11/085909
DATED              : June 27, 2006
INVENTOR(S)       : Robert Callaghan Taft It is certified that error appears in the above-identified patent and that said Letters Patent is hereby corrected as shown below:

Title Page, Item (56)
OTHER PUBLICATIONS, Page 2: " Robert C. Taft et al.," should read --Robert C. Taft et al.--

Column 10, Line 53: "a setoff" should read -- a set of --

Signed and Sealed this

Thirteenth Day of March, 2007

JON W. DUDAS
*Director of the United States Patent and Trademark Office*